US006998640B2

(12) United States Patent
Wang et al.

(10) Patent No.: US 6,998,640 B2
(45) Date of Patent: Feb. 14, 2006

(54) THIN FILM TRANSISTOR STRUCTURE

(75) Inventors: Cheng-Chi Wang, Tainan (TW);
Chin-Lung Ting, Taipei (TW)

(73) Assignee: Chi Mei Optoelectrnics Corp., Tainan (TW)

( * ) Notice: Subject to any disclaimer, the term of this patent is extended or adjusted under 35 U.S.C. 154(b) by 94 days.

(21) Appl. No.: 10/659,117

(22) Filed: Sep. 10, 2003

(65) Prior Publication Data

US 2004/0063254 A1     Apr. 1, 2004

(30) Foreign Application Priority Data

Sep. 27, 2002   (TW) .............................. 91122420 A

(51) Int. Cl.
*H01L 29/04*     (2006.01)
(52) U.S. Cl. .......................................... 257/59; 257/72
(58) Field of Classification Search ................ 257/59, 257/72, 347

See application file for complete search history.

(56) References Cited

U.S. PATENT DOCUMENTS

| | | | | |
|---|---|---|---|---|
| 5,883,682 A | * | 3/1999 | Kim et al. ..................... 349/43 |
| 6,825,497 B1 | * | 11/2004 | Lai .............................. 257/72 |
| 2004/0063254 A1 | * | 4/2004 | Wang et al. ................. 438/149 |

* cited by examiner

*Primary Examiner*—Mark V. Prenty
(74) *Attorney, Agent, or Firm*—Thomas, Kayden, Horstemeyer & Risley, LLP

(57) ABSTRACT

The invention provides a method of manufacturing a thin film transistor capable of reducing the induced photo-electric current and thus improving the quality of the liquid crystal display, and reducing the number of required photo masks saving on the cost of fabrication. A stack structure is formed first, by successively depositing a gate electrode, a first insulation layer, a semiconductor layer, an ohmic contact layer, and a photoresist layer. Subsequently, a second insulation layer is deposited on the substrate, and the photoresist layer and the second insulation layer on the photoresist layer are removed in a lift-off process. Last, a source electrode, a drain electrode, a passivation layer, and a transparent electrode layer, are formed to complete the thin film transistor process.

12 Claims, 6 Drawing Sheets

THIN FILM TRANSISTOR STRUCTURE

This application claims the benefit of Taiwan application Serial No. 91122420, filed Sep. 27, 2002.

BACKGROUND OF THE INVENTION

1. Field of the Invention

The invention relates in general to a thin film transistor (TFT) substrate and method of manufacturing the same, and more particularly to a thin film transistor substrate capable of reducing the number of required photo masks and method of manufacturing the same.

2. Description of the Related Art

Thin film transistors have been largely applied in fabrication of liquid crystal displays. The typical process for manufacturing a thin film transistor substrate will be described in FIG. 1 to FIG. 5 as below.

Referring to FIG. 1, a cross-sectional view of a gate electrode formed on a substrate in the prior art is shown. A substrate 100 is provided first, and then a gate-electrode layer (not shown in FIG. 1) is deposited on the substrate 100. The gate-electrode layer is subsequently patterned by photolithography and etching to form a gate electrode 110.

Referring to FIG. 2, a cross-sectional view of the formation of a gate insulation layer, a semiconductor layer, and an ohmic contact layer on the substrate in the prior art is shown. After the gate electrode 110 is fabricated, a gate insulation layer 120 is formed on the substrate 100. Afterward a semiconductor layer 130 and an ohmic contact layer 140 are successively deposited on the gate insulation layer 120 and further etched by covering a patterned photoresist layer (not shown in FIG. 2) on the ohmic contact layer as a mask. Lastly, the patterned photoresist layer is removed as shown in FIG. 2.

Referring to FIG. 3, a cross-sectional view illustrating the formation of a drain electrode and a source electrode in the prior art is shown. A metal layer, deposited on the substrate 100, is patterned by photolithography and etching to form a drain electrode 160, a source electrode 165, and an opening above the gate electrode 110, which exposes the semiconductor layer 130.

Referring to FIG. 4, a cross-sectional view illustrating the formation of a passivation layer on the substrate in the prior art is shown. A passivation layer 170 is deposited on the substrate 100, and a contact hole in the passivation layer is formed to expose the drain electrode 160 by photolithography and etching.

Referring to FIG. 5, a cross-sectional view illustrating a transparent electrode layer in the prior art is shown. A transparent electrode layer 180 is deposited on the passivation layer 170 to fill the contact hole in the passivation layer 170. Similarly, the transparent electrode layer 180 is patterned by photolithography and etching to form a pixel electrode as shown in FIG. 5. The typical thin film transistor substrate fabrication as mentioned above requires a process using five photo masks as shown in FIG. 1 to FIG. 5 respectively, which can not satisfy the need for low cost.

In order to reduce the cost, a method of thin film transistor fabrication using only four photo masks has been developed, which is accomplished by combining two patterning processes in FIG. 2 and FIG. 3 to one photo-mask process. However, the thin film transistor substrate formed by using four photo masks gives rise to the problem that light emitted from the bottom of the substrate and provided for the liquid crystal display will illuminate the semiconductor layer to induce a photoelectric current, thereby worsening the "off" behavior of the thin film transistor and reducing the quality of the liquid crystal display.

SUMMARY OF THE INVENTION

It is therefore an object of the invention to provide an improved thin film transistor substrate capable of solving the photoelectric current problem and reducing the cost and method of manufacturing the same.

The invention achieves the above-identified objects by providing a thin film transistor manufacturing method, comprising the steps of forming a first stack structure and a second stack structure on the substrate, the first stack structure comprises layers successively disposed which are a first conduction layer, a first insulation layer, a first semiconductor layer, a first ohmic contact layer, and a first photoresist layer, the second stack structure comprises layers successively disposed which are a second conduction layer, a second insulation layer, a second semiconductor layer, a second ohmic contact layer, and a second photoresist layer, wherein the first photoresist layer has a first thickness, and the second photoresist layer has a second thickness which is thinner than the first thickness; ashing the first and the second photoresist layers and removing at least the second ohmic contact layer, the second semiconductor layer to form a third stack structure and a fourth stack structure, wherein the third stack structure comprises the first conduction layer, the first insulation layer, the first semiconductor layer, the first ohmic contact layer, and a third photoresist layer, and the fourth stack structure comprises at least the second conduction layer; forming a third insulation layer on the substrate; lifting off the third photoresist layer to remove the third insulation layer on the third photoresist layer; forming a third conduction layer on the substrate; patterning the third conduction layer to expose a part of the first semiconductor layer and the third insulation layer on the fourth stack structure and to form drain and source electrodes; forming a passivation layer on the substrate; patterning the passivation layer and the third insulation layer to expose a part of the third conduction layer and a part of the second conduction layer; and forming a transparent conduction layer on the passivation layer and the third conduction layer, wherein a first part of the transparent conduction layer is used to be a pixel electrode connecting to the third conduction layer, and a second part of the transparent conduction layer is connected to the second conduction layer.

The invention achieves the above-identified objects by providing a thin film transistor substrate comprising at least a first stack structure and a second stack structure on the substrate, wherein the first stack structure comprises successively deposited layers including a first conduction layer, a first insulation layer, and a semiconductor layer, and the second stack structure at least includes a second conduction layer; an ohmic contact layer on a first region and a second region of the semiconductor layer, where the first region and the second region are disconnected; a second insulation layer, positioned at least on the side surfaces of the first stack structure and the second stack structure and a part of the upper surface of the second stack structure; a source electrode and a drain electrode, wherein the source electrode is positioned on a part of the second insulation layer and the ohmic contact layer in the first region, and the drain electrode is positioned on a part of the second insulation layer and the ohmic contact layer in the second region; a passivation layer, positioned on the semiconductor layer, the source and the drain electrodes, and the second insulation layer; and a transparent conduction layer, disposed on the passivation layer, wherein a first portion of the transparent conduction layer is electrically coupled to one of the source and the drain electrode and a second portion of the transparent conduction layer is electrically coupled to the second conduction layer of the second stack structure.

Other objects, features, and advantages of the invention will become apparent from the following detailed description of the preferred but non-limiting embodiments. The following description is made with reference to the accompanying drawings.

DETAILED DESCRIPTION OF THE INVENTION

The method according to the invention is to provide a thin film transistor substrate, requiring only four photo masks in fabrication, and to avoid the photoelectric current induction by forming a stack structure including a gate electrode, an insulation layer, a semiconductor layer, and an ohmic layer, and performing a lift-off procedure. A first preferred embodiment of the invention is described in accordance with FIG. 6 to FIG. 11, and a second preferred embodiment of the invention is described in accordance with FIG. 12 to FIG. 18.

Figure 1:
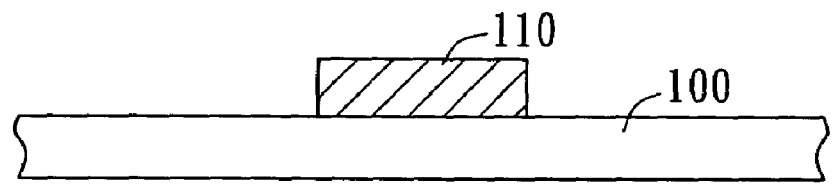
FIGS. 1 to 5 are cross-sectional views showing the conventional fabrication of a thin film transistor substrate.
Figure 2:
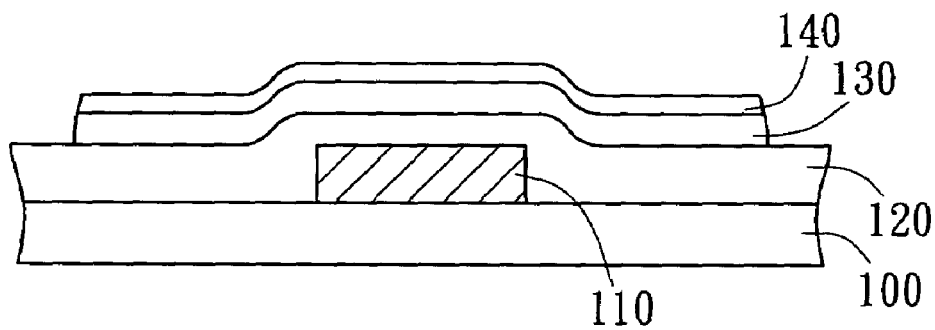
Figure 3:
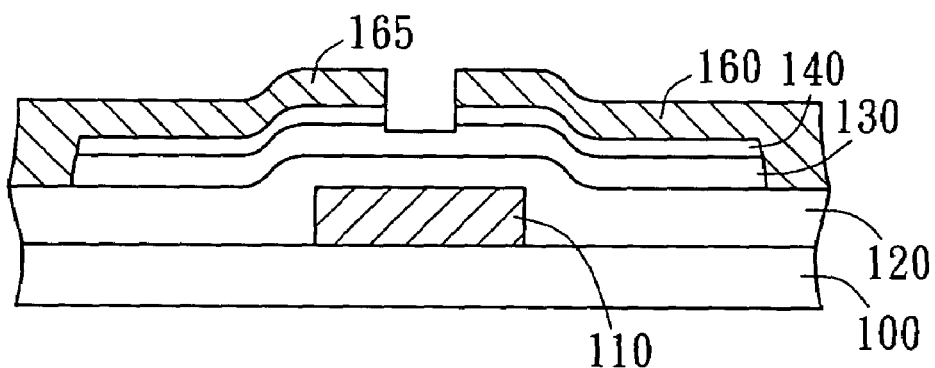
Figure 4:
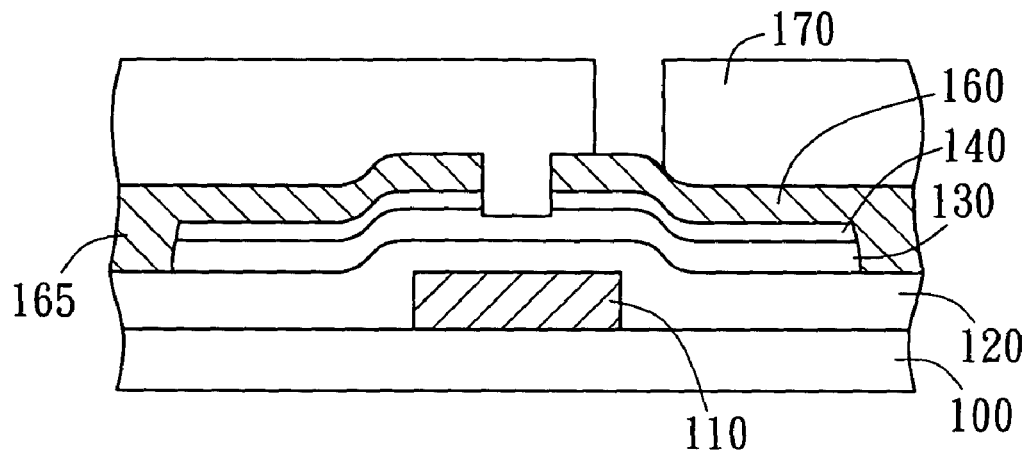
Figure 5:
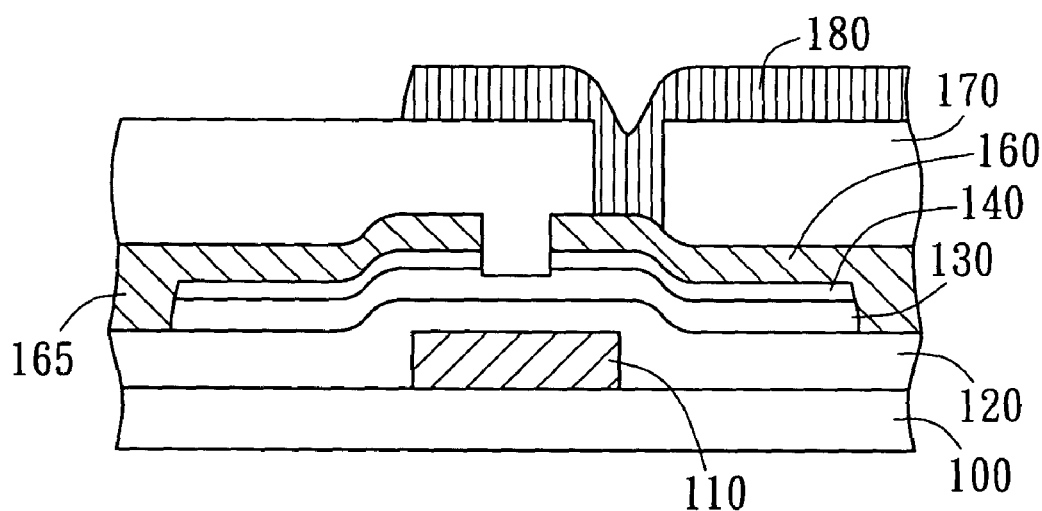
Figure 6:
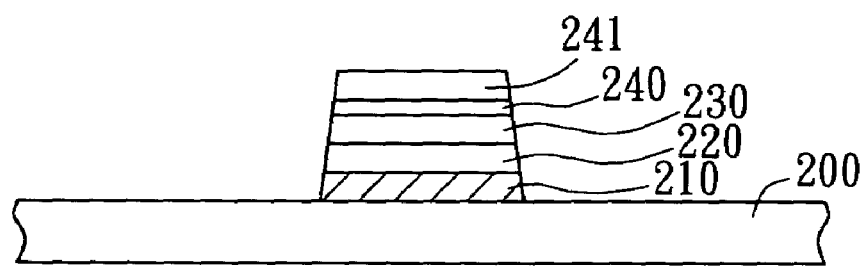
FIGS. 6 to 11 are cross-sectional views illustrating the fabrication of a thin film transistor according to a first preferred embodiment of the invention.

Referring to FIG. 6, a cross-sectional view of a stack structure formed according to a first preferred embodiment of the invention is shown. First, a substrate 200 is provided, and a gate-electrode layer, a first insulation layer, a semiconductor layer such as amorphous silicon layer, an ohmic contact layer, and a photoresist layer (not shown in FIG. 6) are successively deposited on the substrate 200. Subsequently, the photoresist layer is patterned by exposure and photolithography to form a photoresist layer 241. The ohmic contact layer, the semiconductor layer, the first insulation layer, and the gate-electrode layer are further etched by using the photoresist layer as a mask to form a stack structure including a gate electrode 210, a first insulation layer 220, a semiconductor layer 230, and an ohmic contact layer 240; and the photoresist layer 241 is preserved on the stack structure as shown in FIG. 6. The gate-electrode layer 210, the first insulation layer 220, and the ohmic contact layer 240 can respectively be a metal layer, a silicon-nitride layer, and an amorphous silicon layer doped by phosphorous ions.

Figure 7:
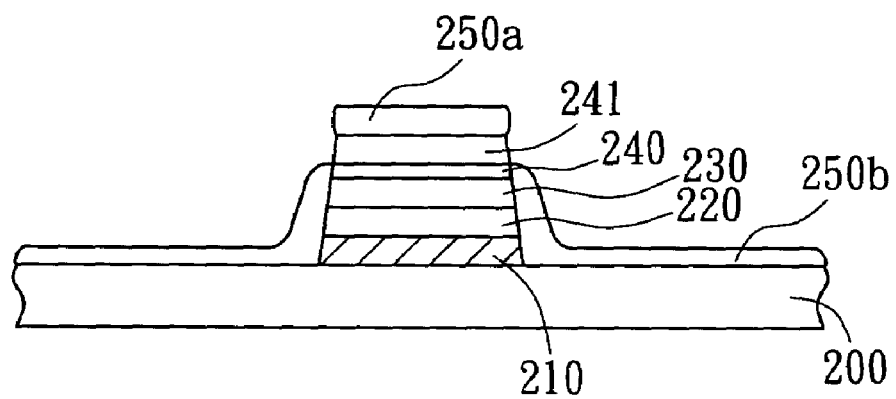

Referring to FIG. 7, a cross-sectional view illustrating the formation of the second insulation layers with silicon nitride or silicon oxide on the substrate is shown. A second insulation layer 250a is deposited on the photoresist layer 241, and a second insulation layer 250b is deposited on the side surfaces of the stack structure to protect the stack structure as shown in FIG. 7.

Figure 8:
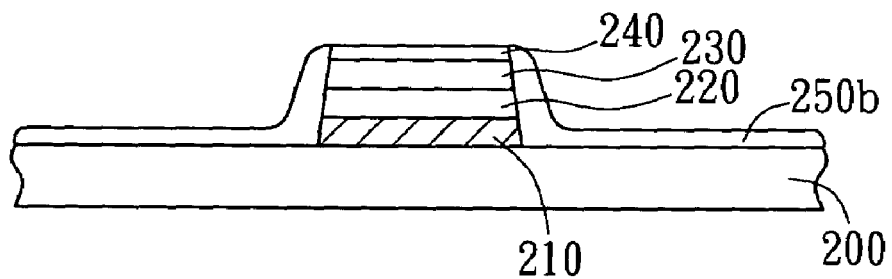

Referring to FIG. 8, a cross-sectional view of the lift-off process of the photoresist layer according to the first preferred embodiment of the invention is shown. Since the second insulation layer 250a is positioned on the photoresist layer 241, the second insulation layer 250a will be removed while the photoresist layer 241 is removed.

Figure 9:
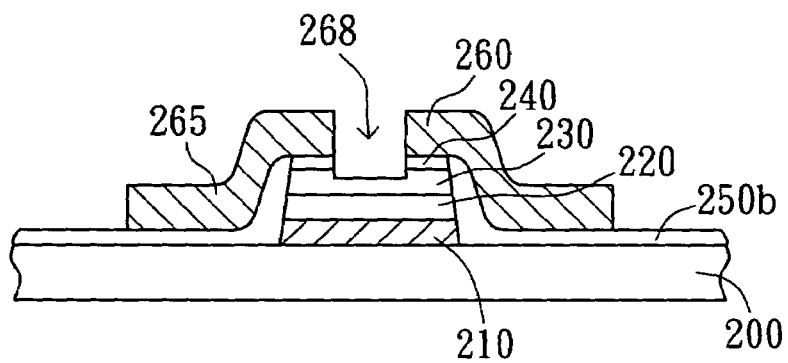

Referring to FIG. 9, a conduction layer is formed on the second insulation layer 250b and the ohmic contact layer 240. The conduction layer and the ohmic contact layer 240 are patterned by photolithography and etching method to form an opening 268 in the conduction layer, a source electrode 260 and a drain electrode 265. The conduction layer of the invention can be a metal layer made of a material such as chromium, molybdenum, aluminum, copper, titanium, tantalum, and tungsten.

Figure 10:
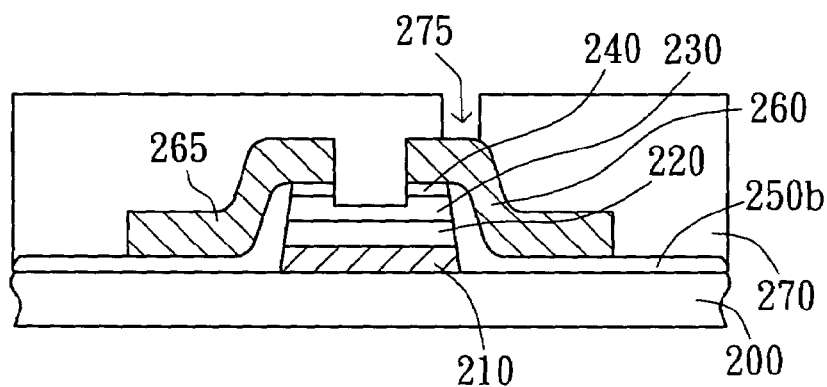

Referring to FIG. 10, a passivation layer 270 is deposited over the substrate 200 to fill the opening 268 for further processing. Afterwards, the passivation layer 270 is patterned by photolithography and etching method to form a contact hole 275 in the passivation layer 270, which exposes the drain electrode 265 or the source electrode 260 as shown in FIG. 10. The passivation layer 270 is usually formed of an insulating material, such as silicon nitride.

Figure 11:
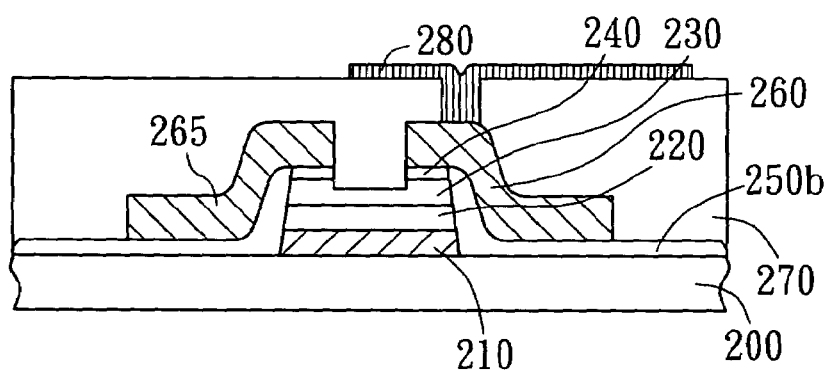

Referring to FIG. 11, a transparent electrode layer 280, deposited on the passivation layer 270 to fill the contact hole 275, is patterned by photolithography and etching method to complete the thin film transistor substrate as shown in FIG. 11. The transparent electrode is made of indium-tin-oxide (ITO).

According to the first preferred embodiment disclosed in FIG. 6 to FIG. 11, only four photo masks are required, as respectively shown in FIG. 6, FIG. 9, FIG. 10, and FIG. 11. The process using only four photo masks, eliminating one photo mask procedure compared with the typical process, will save in the cost of fabrication. Moreover, when the thin film transistor substrate of the invention is applied to the liquid crystal display, since the semiconductor layer 230 and the gate electrode 210 are formed by the same patterning process, light emitted from the bottom of the substrate 200 will be protected by the gate electrode 210 from illuminating the semiconductor layer 230 directly to induce a photoelectric current. Therefore, the quality of the liquid crystal display in the invention can be improved.

Figure 12:
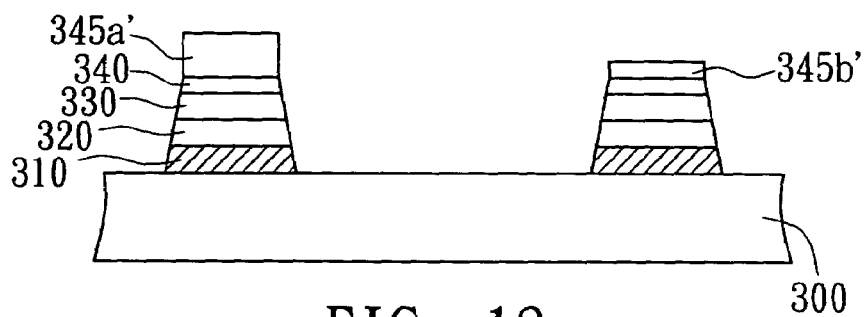
FIGS. 12 to 18 are cross-sectional views illustrating the fabrication of a thin film transistor according to a second preferred embodiment of the invention.
Figure 13:
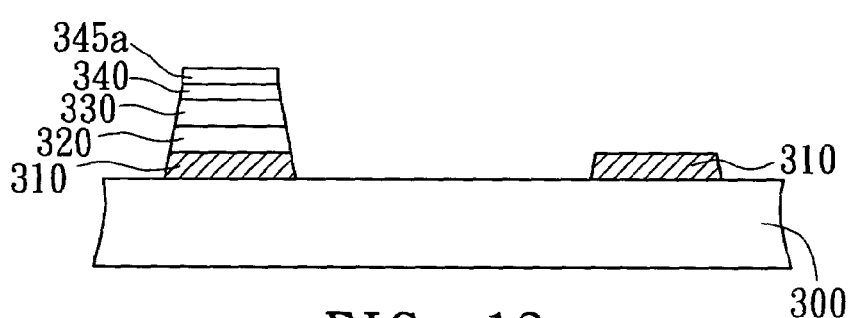

Referring to FIG. 12 to FIG. 18, cross-sectional views of the fabrication of a thin film transistor according to a second preferred embodiment of the invention are shown. FIG. 12 and FIG. 13 are cross-sectional views illustrating the formation of a first stack structure and a second stack structure.

In FIG. 12, a gate-electrode layer, a first insulation layer, a semiconductor layer, and an ohmic contact layer are successively deposited on a substrate 300. Subsequently, the photoresist layers 345a' and 345b' can be formed by a half-tone photo mask process, where the photoresist layer 345a' is thicker than the photoresist layer 345b'.

By using the photoresist layers 345a' and 345b' as masks, the ohmic contact layer, the semiconductor layer, the first insulation layer, and the gate-electrode layer are further etched to form a gate-electrode layer 310, a first insulation layer 320, a semiconductor layer 330, and an ohmic contact layer 340 as shown in FIG. 12.

An ashing process is conducted. Referring to FIG. 13, in the ashing process, the ohmic contact layer 340, the semiconductor layer 330, and the gate-electrode layer 320 under the photoresist layer 345b' will be removed for the photoresist layer 345b' is ashed up while those layers under the photoresist layer 345a' will remain due to the protection by the layer 345a ashed from the photoresist layer 345a' as shown in FIG. 13. As a result, a first stack structure, including the gate-electrode layer 310, the insulation layer 320, the semiconductor layer 330, and the ohmic contact layer 340, is formed under the photoresist layer 345a, meanwhile a second stack structure including the gate-electrode layer 310 is formed. According to the requirements of the etching process, the insulation layer 320 under the photoresist layer 345b' can also be preserved.

Figure 14:
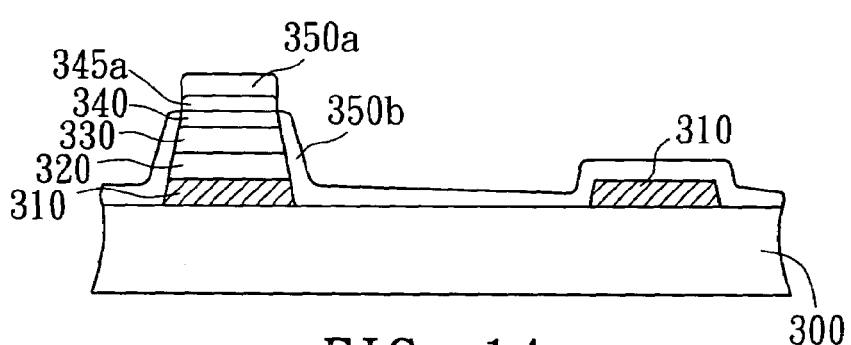

Referring to FIG. 14, second insulation layers 350a, and 350b, made of silicon nitride or silicon oxide, are deposited on the substrate 300 to cover the first and the second stack structures. The second insulation layer 350a is positioned on the first stack structure, and the second insulation layer 350b is positioned on the other region of the substrate 300, such as the side surfaces of the first and the second stack structures.

Figure 15:
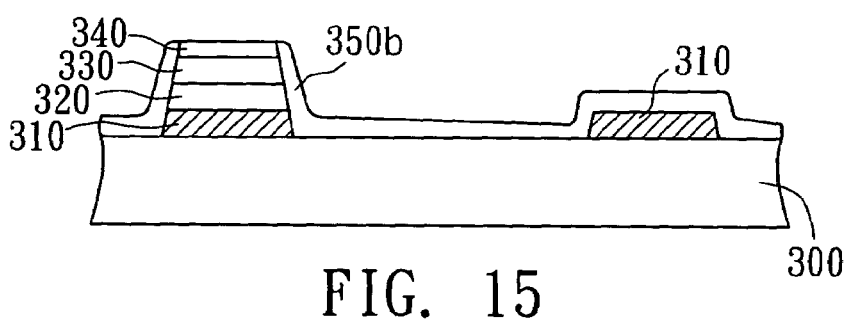

Referring to FIG. 15, the photoresist layer 345a is lifted off during the ashing process. Since the second insulation layer 350a is positioned on the photoresist layer 345a, the second insulation layer 350a will be removed as soon as the photoresist layer is lifted off.

Figure 16:
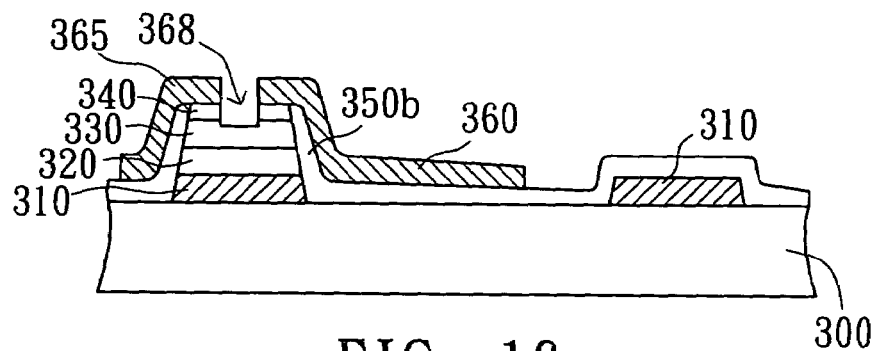

Referring to FIG. 16, a conduction layer is formed on the second insulation layer 350b and the ohmic contact layer 340. The conduction layer and the ohmic contact layer 340 are patterned by photolithography and etching method to form a conductive source electrode 360, a conductive drain electrode 365, and a opening 368 in the conduction layer, which exposes the semiconductor layer 330. The conduction layer in the invention can be a metal layer made of materials such as chromium, molybdenum, aluminum, copper, titanium, tantalum, and tungsten.

Figure 17:
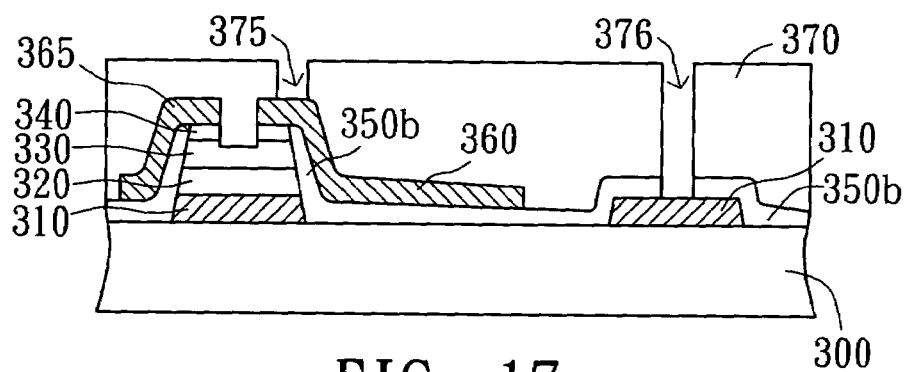

Referring to FIG. 17, a passivation layer 370 is formed on the substrate 300 to fill the opening 368. Subsequently, the passivation layer 370 and the second insulation layer 350b are patterned by photolithography and etching method to form a contact hole 375 in the passivation layer 370, which exposes the source electrode 360 and forms a contact hole 376, which exposes the first conduction layer 310 of the second stack structure as shown in FIG. 17. The passivation layer is usually formed of an insulator, such as silicon dioxide.

Figure 18:
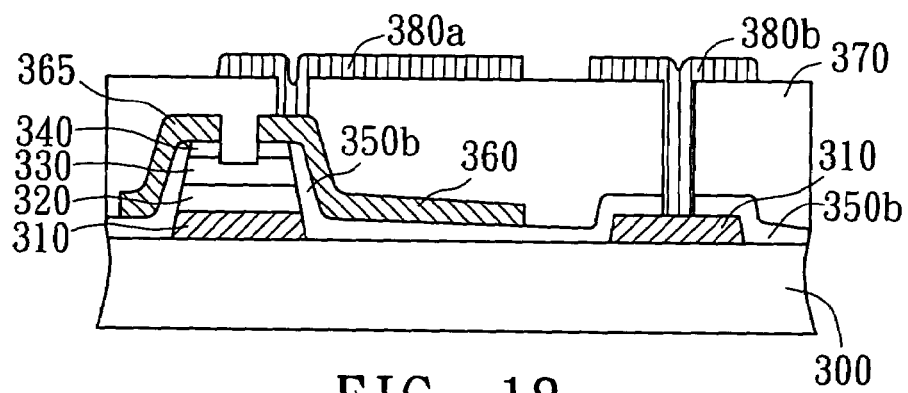

Referring to FIG. 18, a cross-sectional view of a transparent electrode layer formed according to the second preferred embodiment of the invention is shown. A transparent electrode layer 380 is formed on the passivation layer 370 to fill the contact holes 375 and 376. The transparent electrode layer 380 is further patterned by photolithography and etching method to complete the thin film transistor substrate as shown in FIG. 18. The transparent electrode layer 380 is formed of indium-tin-oxide, and electrically coupled with the source electrode 360 and the gate-electrode layer 310. The part of the transparent electrode layer 380 connected to the source electrode 360 is used as a pixel electrode. Moreover, the transparent electrode layers 380a and 380b, respectively, are electrically coupled with the source electrode 360 and the gate electrode 310 and can be either connected to each other or disconnected as needed.

According to the second preferred embodiment disclosed in FIG. 12 to FIG. 18, only four photo masks are required as respectively shown in FIG. 13, FIG. 16, FIG. 17, and FIG. 18, which reduces the process by one photo mask compared with the typical process, thereby reducing fabrication costs. When the thin film transistor substrate of the invention is applied to the liquid crystal display, light emitted from the bottom of the substrate 300 will be protected by the gate electrode 210 from illuminating the semiconductor layer 230 directly to induce a photo-electric current. Therefore, the "off" behavior of the thin film transistor can be improved and thus the quality of the liquid crystal display of the invention can be enhanced.

According to the preferred embodiments described above, the invention utilizes a lift-off process to reduce the number of photo masks needed during fabrication, thereby reducing manufacturing costs, and utilizes the stack structure including the gate-electrode layer, the insulation layer, the semiconductor layer, and the ohmic contact layer to avoid photoelectric current induction from illumination, thereby improving the quality of the liquid crystal display. As a result, the liquid crystal display produced using the invention has both the advantages of higher quality and lower cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A thin film transistor substrate, comprising at least:
   a first stack structure and a second stack structure on the substrate, wherein the first stack structure comprises layers successively disposed which are a first conduction layer, a first insulation layer, and a semiconductor layer, and the second stack structure at least includes a second conduction layer;
   an ohmic contact layer on a first region and a second region of the semiconductor layer, where the first region and the second region are disconnected;
   a second insulation layer, positioned at least on the side surfaces of the first stack structure and the second stack structure and a part of the upper surface of the second stack structure;
   a source electrode and a drain electrode, wherein the source electrode is positioned on a part of the second insulation layer and the ohmic contact layer in the first region, and the drain electrode is positioned on a part of the second insulation layer and the ohmic contact layer in the second region;
   a passivation layer, positioned on the semiconductor layer, the source and the drain electrodes, and the second insulation layer; and
   a transparent conduction layer, disposed on the passivation layer, wherein a first portion of the transparent conduction layer is electrically coupled to one of the source and the drain electrode and a second portion of the transparent conduction layer is electrically coupled to the second conduction layer of the second stack structure.

2. The substrate according to claim 1, wherein the second insulation layer is further deposited between the first stack structure and the second stack structure.

3. The substrate according to claim 1, wherein the first portion and the second portion of the transparent conduction layer is disconnected.

4. The substrate according to claim 1, wherein the first portion and the second portion of the transparent conduction layer is connected.

5. The substrate according to claim 1, wherein the first conduction layer and the second conduction layer are gate electrodes.

6. The substrate according to claim 1, wherein the transparent electrode layer is formed of indium-tin-oxide (ITO).

7. A thin film transistor substrate, comprising:
a plurality of stack structures on the substrate, wherein each stack structure comprises layers successively disposed which are a first conduction layer, a first insulation layer, and a semiconductor layer;
an ohmic contact layer, positioned on a first region and a second region of the semiconductor layer, where the first region and the second region are disconnected;
a second insulation layer, positioned at least on side surfaces of the stack structures, wherein the second insulation layer is formed of silicon nitride;
a source electrode and a drain electrode, wherein the source electrode is positioned at least on the ohmic contact layer in the first region, and the drain electrode is positioned at least on the ohmic contact layer in the second region;
a passivation layer, positioned on the semiconductor layer and the source and to drain electrodes; and
a transparent conduction layer, positioned on the passivation layer and electrically coupled to one of the source and the drain electrodes.

8. A thin film transistor substrate, comprising:
a plurality of stack structures on the substrate, wherein each stack structure comprises layers successively disposed which are a first conduction layer, a first insulation layer, and a semiconductor layer;
an ohmic contact layer, positioned on a first region and a second region of the semiconductor layer, where the first region and the second region are disconnected;
a second insulation layer, positioned at least on side surfaces of the stack structures, wherein the second insulation layer is formed of silicon nitride;
a source electrode and a drain electrode, wherein the source electrode is positioned at least on the ohmic contact layer in the first region, and the drain electrode is positioned at least on the ohmic contact layer in the second region, and wherein at least one of the source electrode and the drain electrode is positioned on a part of the second insulation layer;
a passivation layer, positioned on the semiconductor layer and the source and the drain electrodes; and
a transparent conduction layer, positioned on the passivation layer and electrically coupled to one of the source and the drain electrodes.

9. The substrate according to claim 7, wherein the second insulation layer is further deposited among the stack structures.

10. The substrate according to claim 7, wherein the first conduction layer is a gate electrode.

11. The substrate according to claim 7, wherein the transparent electrode layer is formed of indium-tin-oxide.

12. The substrate according to claim 7, wherein the passivation layer is further positioned on the second insulation layer.

* * * * *